(12) United States Patent
Ichien

(10) Patent No.: US 9,807,189 B2
(45) Date of Patent: *Oct. 31, 2017

(54) DATA TRANSFER DEVICE AND DATA TRANSFER SYSTEM USING ADAPTIVE COMPRESSION ALGORITHM

(71) Applicant: NEC Corporation, Minato-ku, Tokyo (JP)

(72) Inventor: Masumi Ichien, Tokyo (JP)

(73) Assignee: NEC CORPORATION, Tokyo (JP)

( * ) Notice: Subject to any disclaimer, the term of this patent is extended or adjusted under 35 U.S.C. 154(b) by 164 days.

This patent is subject to a terminal disclaimer.

(21) Appl. No.: 14/435,500

(22) PCT Filed: Oct. 7, 2013

(86) PCT No.: PCT/JP2013/077211
§ 371 (c)(1),
(2) Date: Apr. 14, 2015

(87) PCT Pub. No.: WO2014/061481
PCT Pub. Date: Apr. 24, 2014

(65) Prior Publication Data
US 2015/0304441 A1     Oct. 22, 2015

(30) Foreign Application Priority Data

Oct. 19, 2012 (JP) ................. 2012-231674
Mar. 21, 2013 (JP) ................. 2013-058937

(51) Int. Cl.
G06F 15/16 (2006.01)
H04L 29/08 (2006.01)
(Continued)

(52) U.S. Cl.
CPC ...... H04L 67/2828 (2013.01); H03M 7/6094 (2013.01); H04L 47/30 (2013.01);
(Continued)

(58) Field of Classification Search
CPC ............... H04L 67/10; H04L 67/2828
(Continued)

(56) References Cited

U.S. PATENT DOCUMENTS 7,930,436 B1 * 4/2011 Znosko ............... H04L 69/04
330/252
7,966,399 B2 * 6/2011 Jones ................... G06F 15/16
382/128

(Continued)

FOREIGN PATENT DOCUMENTS

JP    S62182919 A    8/1987
JP    H01108631 A    4/1989
(Continued)

OTHER PUBLICATIONS

Fine-Grain Adaptive Compression in Dynamically, Calton and Lenin Singaravelu, CERCS, GiorgiaInstitute Technology, 2005.*
(Continued)

*Primary Examiner* — David Lazaro
*Assistant Examiner* — Marie Georges Henry

(57) ABSTRACT

A data transfer device compresses and transfers data according to a priority given to a CPU-constraint process imposing a constraint to a compression processing speed over a NW bandwidth-constraint process imposing a constraint to a transfer processing speed. It is necessary to select a compression algorithm, applied to the CPU-constraint process or the NW bandwidth-constraint process, based on a NW bandwidth, compressibility, and compression processing speed maximizing an effective throughput. When the amount of compressed data held in a temporary hold part is smaller than the predetermined value, the compressed data of the NW bandwidth-constraint process is stored in a temporary hold part. When the amount of compressed data held by the temporary hold part is larger than the predetermined value, the compressed data of the CPU-constraint (Continued)

process is stored in the temporary hold part. Thus, it is possible to improve an effective throughput by effectively using NW bandwidths.

7 Claims, 7 Drawing Sheets

(51) Int. Cl.
    *H03M 7/30*     (2006.01)
    *H04L 29/06*     (2006.01)
    *H04L 12/811*     (2013.01)
    *H04L 12/835*     (2013.01)

(52) U.S. Cl.
    CPC .............. *H04L 47/38* (2013.01); *H04L 67/10* (2013.01); *H04L 69/04* (2013.01)

(58) Field of Classification Search
    USPC ................................................ 709/247, 217
    See application file for complete search history.

(56) References Cited

U.S. PATENT DOCUMENTS

| | | | |
|---|---|---|---|
| 2007/0109153 A1 | 5/2007 | Ma et al. | |
| 2009/0300167 A1 | 12/2009 | Jones et al. | |
| 2011/0106877 A1* | 5/2011 | Hsieh | H04L 67/06 709/203 |
| 2011/0208833 A1* | 8/2011 | Fallon | H04N 9/8042 709/217 |
| 2013/0290281 A1* | 10/2013 | Yokoi | G06F 3/0608 707/693 |

FOREIGN PATENT DOCUMENTS

| | | |
|---|---|---|
| JP | 5-145437 A | 6/1993 |
| JP | 7-162460 A | 6/1995 |
| JP | H08147251 A | 6/1996 |
| JP | 2746092 B2 | 4/1998 |
| JP | 3329390 B2 | 9/2002 |
| JP | 2005092858 A | 4/2005 |
| JP | 2005149347 A | 6/2005 |
| JP | 2008-160535 A | 7/2008 |
| JP | 2009259017 A | 11/2009 |
| JP | 2010021743 A | 1/2010 |
| JP | 2010-141515 A | 6/2010 |
| WO | 2004093446 A1 | 10/2004 |
| WO | 2006/054618 A1 | 5/2006 |
| WO | 2008/126274 A1 | 10/2008 |

OTHER PUBLICATIONS

CPU and L.Singaravelu, "Fine-grain adaptive compression in dynamically variable networks", in International Conference on Distributed Computing Systems, 2005, pp. 685-694.

International Search Report of PCT Application No. PCT/JP2013/077211 dated Dec. 17, 2013.

International Search Report dated Jun. 10, 2014 from the International Searching Authority in counterpart International Application No. PCT/JP2014/059148.

Communication dated Sep. 22, 2016 from the U.S. Patent and Trademark Office in counterpart U.S. Appl. No. 14/782,022.

* cited by examiner

| ALGORITHM IDENTIFICATION NUMBER $i$ | 1 | 2 | 3 |
|---|---|---|---|
| COMPRESSION PROCESSING SPEED $C_i$ (MB/S) | 108.89 | 17.88 | 512950 |
| COMPRESSIBILITY $R_i$ | 0.68 | 0.38 | 1 |
| DATA RATE $X_i$ | 0.22 | 0.77 | 0 |
| $PC_iR_i$ | 370.22 | 33.972 | - |

DATA TRANSFER DEVICE AND DATA TRANSFER SYSTEM USING ADAPTIVE COMPRESSION ALGORITHM

This application is a National Stage Entry of PCT/JP2013/077211 filed on Oct. 7, 2013, which claims priority from Japanese Patent Application 2012-231674 filed on Oct. 19, 2012 and Japanese Patent Application 2013-058937 filed on Mar. 21, 2013, the contents of all of which are incorporated herein by reference, in their entirety.

TECHNICAL FIELD

The present invention relates to a data transfer device and a data transfer system which are designed to compress data according to a desired compression algorithm so as to transfer compressed data to a network.

The present application claims priority on Japanese Patent Application No. 2012-231674 filed Oct. 19, 2012 and Japanese Patent Application No. 2013-58937 filed Mar. 21, 2013, the entire contents of which are incorporated herein by reference.

BACKGROUND ART

Conventionally, data transfer devices and data transfer systems, which are designed to compress data according to predetermined compression algorithms so as to transfer compressed data to networks, have been developed, and therefore data transfer technologies using compression algorithms have been disclosed in various documents. Patent Literature Document 1 discloses a parallel computer of a distributed storage type, which is improved in terms of throughputs when transferring messages through networks connecting a plurality of processor nodes. Patent Literature Document 2 discloses a high-speed batch file transfer method and device which is able to demonstrate an adequate performance of a high-speed computer network by improving throughputs in file transfer modes. Patent Literature Document 3 discloses a data transfer processing system which is designed to selectively execute data compression and data non-compression. Patent Literature Document 4 discloses a file transfer system which is designed to determine necessity concerning data compression for each type of file. Patent Literature Document 5 discloses a data transfer control device which is designed to carry out a compression process on uncompressed data while transferring compressed data to a computer in a data transfer operation between a computer and a data compression device. Non-Patent Literature Document 1 discloses a technology of improving an effective throughput by concurrently carrying out a CPU-bound compression process and an I/O-bound transfer process.

CITATION LIST

Patent Literature Document

Patent Literature Document 1: Japanese Patent Application Publication No. H08-147251
Patent Literature Document 2: Japanese Patent No. 3329390 Patent Literature Document 3: Japanese Patent Application Publication No. H01-108631
Patent Literature Document 4: Japanese Patent No. 2746092 Patent Literature Document 5: Japanese Patent Application Publication No. S62-182919

NON-PATENT LITERATURE DOCUMENT

Non-Patent Literature Document 1: CPU and L. Singaravelu, "Fine-grain adaptive compression in dynamically variable networks", in International Conference on Distributed Computing Systems, 2005, pp. 685-694

SUMMARY OF INVENTION

Technical Problem

Patent Literature Document 1 is directed to a parallel computer which includes a plurality of processors connected through networks so as to compress data being transferred between processors, wherein it is possible to reduce the amount of transferred data by transferring compressed data between processors, thus improving an effective throughput.

To improve an effective throughput by way of data compression, it is necessary to further reduce the amount of transferred data by increasing compressibility, thus further improving an effective throughput. However, increasing compressibility may cause a time variance between a compression process and a transfer process; this may cause a problem since it is impossible to effectively use network bands.

Problems of the prior art will be described in details with reference to FIG. 7, Patent Literature Documents 1 to 3, and Non-Patent Literature Document 1. FIG. 7 is a block diagram showing a basic configuration of a data transfer system. The data transfer system includes a data transfer device 1, a network 2, and an analysis device 3. The data transfer device 1 includes a data storage unit 1S, an acquisition part 11, a pre-compression data temporary hold part 12, a plurality of compression processors 13, and a transfer part 14.

Recently, parallel processing platforms which are able to carry out high-speed analysis in parallel processing have been incorporated into data processing systems so as to analyze a large amount of data at high speed, thus deducing trends or knowledge. For example, it is possible to analyze trends among customer information, mining of behavior histories, and a large volume of log information by use of Hadoop known as a parallel processing platform. As an example of practically using a parallel processing platform, it is possible to analyze data by importing data, stored in existing systems, into a parallel processing platform. Recently, various services which allow users to easily construct parallel processing platforms on clouds have been developed such that parallel processing platforms can be installed in remote sites.

Speeds of importing data into parallel processing platforms are important for high-speed processing on a large amount of stored data. Conventionally, daily or weekly stored data have been imported into parallel processing platforms by use of an Extract-Transform-Load (ETL) tool or a user's independent tool. However, the increased amount of data may require long times in importing data into parallel processing platforms, which in turn require long periods of time in batch processing of entire data. Additionally, users may make high demands to rapidly analyze a large amount of data being continuously generated. As the related technology, it is known that a near real-time ETL can be used to analyze a large amount of data in real time by repeating online batch processing in short times based on daily offline back processing.

Network bandwidths may cause bottlenecks in importing data. It is possible to achieve broadband I/O techniques using recent storage techniques (i.e. disk parallelism using Disk Array, storage systems using high-speed flash memory, etc.). Using these storage systems may possibly reduce network bandwidths. A phenomenon causing narrow network bandwidths may possibly occur in parallel processing platforms installed in remote sites.

In a technology of eliminating bottlenecks concerning network bandwidths, it is possible to improve an effective throughput by compressing transferred data. For example, Patent Literature Document 1 aims to improve a throughput in a network transfer process by use of a network adaptor configured to compress transferred data. Patent Literature Document 2 discloses a data compression system adapted to a file transfer process on a low-speed disk. Patent Literature Document 3 discloses a technology, using a compression buffer and a non-compression buffer, which directly transfers data with low compression efficiency so as to prevent a reduction of a performance of transfer processing due to compression processing. However, these technologies cannot improve effective throughputs in transfer processing due to compression processing using redundant calculation resources (e.g. dead cores of multi-core operators).

In Patent Literature Documents 1 and 2 both depending on serial connections of compression processing and transfer processing, the performance of compression processing may directly affect transfer processing. This may incur the possibility of degrading effective throughputs in transfer processing due to variations of calculation resources or performances of compression algorithms. Patent Literature Document 3 discloses the configuration of concurrently executing compression processing and transfer processing; however, it is difficult to realize this technology because of lack of a data compression control means since it is unclear how to improve an effective throughput in transfer processing depending on how much rate data compression should be carried out.

Non-Patent Literature Document 1 discloses a method of improving an effective throughput by concurrently carrying out a CPU-bound compression process and an I/O-bound transfer process. This technology uses a common buffer for a transfer process and a compression process, wherein the compression process fetches data from the buffer, compresses data, and then returns compressed data to the buffer, while the transfer process reads compressed data and uncompressed data from the buffer, mixes those data, and then transfer them. This method can improve an effective throughput by completely using a CPU and network bandwidths. In this connection, Patent Literature Document 1 evaluates a compression process for use in single parallel processing. Recently developed servers, including multiple cores, can further improve effective throughputs by increasing parallelism of compression processes. The data transfer device 1 of FIG. 7 includes a plurality of compression processors 13.

The method of increasing parallelism of compression processes based on the configuration of Patent Literature Document 1 may have a problem in that CPU resources cannot be used effectively. This problem is derived from two causes. The first cause is derived from the same buffer shared between the compression process and the transfer process. Sharing the same buffer may cause two phenomena inducing inefficient usage of CPU resources. In the first phenomenon due to a high-speed transfer process which is generally faster than a compression process, the transfer process may start transferring uncompressed data without waiting for the compression process irrespective of available CPU resources which can be actually used for the compression process. In the second phenomenon, the compression process may fetch compressed data again from the buffer so as to cause a redundant overhead.

The second cause is derived from a limit of using a single type of a compression algorithm. Non-Patent Literature Document 1 discloses the method on the precondition that a data throughput after compression may not exceed a network bandwidth. Recently, however, engineers have developed compression algorithms achieving high-speed compression processing while sacrificing compressibility. Additionally, data throughputs after compression processing may exceed network bandwidths due to increased parallelism of compression processes. In this case, it is impossible to further improve effective throughputs even when CPU resources are allocated to compression processing exceeding network bandwidths; hence, it is impossible to effectively use CPU resources irrespective of available CPU resources.

As described above, the prior art has two problems. According to the first problem, it is impossible to improve effective throughputs by effective using CPU resources in compression processing. This is because the aforementioned two phenomena causing inefficient usage of CPU resources may occur due to the sharing of the common buffer between the compression process and the transfer process. According to the second problem, it is impossible to improve effective throughputs irrespective of available CPU resources for compression processing. This is because it is impossible to further use CPU resource when data throughputs after compression processing exceed network bandwidths according to a single type of a compression algorithm.

The present invention is created in consideration of the foregoing circumstances; hence, it is an object of the invention to provide a data transfer device and a data transfer system, using an adaptive compression algorithm, which are designed to reduce a time variance between a compression process and a transfer process while transferring data through a network, thus effectively using network bandwidths and improving throughputs.

Solution to Problem

A first aspect of the present invention is directed to a data transfer device which compresses data in accordance with a plurality of compression algorithms so as to transfer compressed data according to a priority given to a CPU-constraint process, imposing a constraint to a compression processing speed rather than a transfer processing speed, over an NW bandwidth-constraint process imposing a constraint to a transfer processing speed rather than a compression processing speed. Specifically, the data transfer device includes a compression processing part configured to compress data in accordance with a plurality of algorithms in connection with a CPU-constraint process and an NW bandwidth-constraint process; a temporary hold part configured to temporarily hold compressed data; and a transfer part configured to transfer compressed data, read from the temporary hold part, through a network. The compression processing part stores compressed data according to the NW bandwidth-constraint process in the temporary hold part when the amount of compressed data held by the temporary hold part is smaller than the predetermined value, but the compression processing part stores compressed data according to the CPU-constraint process in the temporary hold part when the amount of compressed data held by the temporary hold part is larger than the predetermined value.

A second aspect of the present invention is directed to a data transfer system including a data transfer device which compresses data in accordance with a plurality of compression algorithms so as to transfer compressed data according to a priority given to a CPU-constraint process, imposing a constraint to a compression processing speed rather than a transfer processing speed, over an NW bandwidth-constraint process imposing a constraint to a transfer processing speed rather than a compression processing speed; and a receiver device which receives compressed data transferred from the data transfer device.

A third aspect of the present invention is directed to a data compression transfer method which compresses data in accordance with to a plurality of compression algorithms so as to transfer compressed data according to a priority given to a CPU-constraint process, imposing a constraint to a compression processing speed rather than a transfer processing speed, over an NW bandwidth-constraint process imposing a constraint to a transfer processing speed rather than a compression processing speed. Specifically, the data compression transfer method is designed to hold compressed data in a temporary hold part before a transfer process, compare the amount of compressed data held by the temporary hold part with the predetermined value, and stores compressed data according to the NW bandwidth-constraint process in the temporary hold part when the amount of compressed data held by the temporary hold part is smaller than the predetermined value, but stores compressed data according to the CPU-constraint process in the temporary hold part when the amount of compressed data held by the temporary hold part is larger than the predetermined value.

Advantageous Effects of Invention

A data transfer device according to the present invention compresses data in accordance with a plurality of compression algorithms so as to transfer compressed data according to a priority given to the CPU-constraint process, imposing a constraint to the compression processing speed rather than the transfer processing speed, over the NW bandwidth-constraint process imposing a constraint to the transfer processing speed rather than the compression processing speed. Compared to the NW bandwidth-constraint process, the CPU-constraint process can achieve high compressibility; hence, it is necessary to select a compression algorithm applied to the CPU-constraint process or the NW bandwidth-constraint process based on the compression processing speed and the compressibility maximizing an effective throughput as well as the NW bandwidth. Thus, it is possible to effectively use NW bandwidths without any wastes and transfer compressed data, thus improving an effective throughput.

DESCRIPTION OF EMBODIMENTS

A data transfer device and a data transfer system according to the present invention will be descried in detail by way of examples with reference to the drawings.

Figure 1:
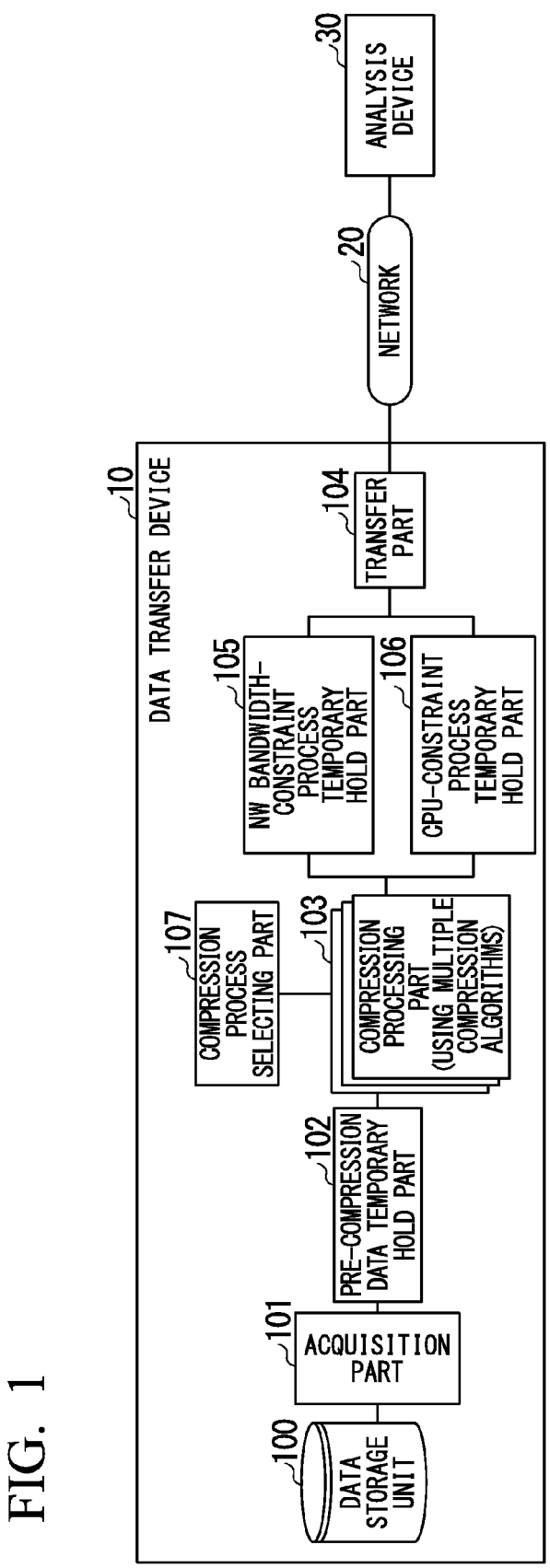
FIG. 1 is a block diagram showing the configuration of a data transfer system according to one embodiment of the present invention.

FIG. 1 is a block diagram showing the configuration of a data transfer system according to one embodiment of the present invention. The data transfer system includes a data transfer device 10, a network 20, and an analysis device 30. The present embodiment includes a single set of the data transmission device 10 and the analysis device 30; but it is possible to arrange multiple sets of those devices. The data transfer device 10 stores unprocessed data before analysis of data from clients providing various services and data from data processing centers. The analysis device 30 carries out the predetermined analysis process on data transferred from the data transfer device 10 through the network 20.

The data transfer device 10 includes a data storage unit 100, an acquire part 101, pre-compression data temporary hold part 102, a plurality of compression processors 103, a transfer part 104, a network (NW) bandwidth-constraint process temporary hold part 105, a CPU-constraint process temporary hold part 106, and a compression process selecting part 107. The data storage part 100 stores a large amount of data; for example, it may employ a database, a file system, or a message queue. The acquisition part 101 reads data from the data storage unit 100 in units of blocks each having the predetermined size. Herein, no constraint is applied to the block size. The pre-compression data temporary hold part 102 temporarily holds data subjected to the compression processing of the compression processors 103. The pre-compression data temporary hold part 102 buffers data acquired by the acquisition part 101 so as to absorb a difference between the processing speeds of the acquisition part 101 and the compression processor 103.

The compression processors 103 selectively carry out a plurality of compression processes. Additionally, the compression processors 103 are able to selectively carry out compression processes and non-compression processes. In the present embodiment, a plurality of compression processors 103 carries out parallel processing. For example, a plurality of CPU cores carries out parallel processing when the compression processors 103 are embodied using a plurality of CPU cores. When the amount of data held by the pre-compression data temporary hold part 102 is smaller than the predetermined amount of data, the compression processors 103 compress data according to the NW bandwidth-constraint processes imposing constraints to transfer processing speeds rather than compression processing speeds, thus storing compressed data in the NW bandwidth-constraint process temporary hold part 105. When the amount of data held by the pre-compression data temporary hold part 102 is larger than the predetermined amount of data, the compression processors 103 compress data according to CPU-constraint processes imposing constraints to compression processing speeds rather than transfer processing speeds, thus storing compressed data in the CPU-constraint process temporary hold part 106.

The compression processors 103 carry out CPU-constraint processes or NW bandwidth-constraint processes in accordance with the compression processes selected by the compression process selecting part 107. When the NW bandwidth-constraint process temporary hold part 105 is ready to store data, the compression processor 103 compresses data according to the NW bandwidth-constraint process so as to store compressed data in the NW bandwidth-constraint process temporary hold part 105. In contrast, the NW bandwidth-constraint process temporary hold part 105 is not ready to store data but the CPU-constraint process temporary hold part 106 is ready to store data, the compression processor 103 compresses data according to the CPU-constraint process so as to store compressed data in the CPU-constraint process temporary hold part 106.

The transfer part 104 fetches compressed data from the NW bandwidth-constraint process temporary hold part 105 or the CPU-constraint process temporary hold part 106 so as to transfer the compressed data to the analysis device 30. The present embodiment preferentially transfers the compressed data stored in the CPU-constraint process temporary hold part 106 over the compressed data stored in the NW bandwidth-constraint process temporary hold part 105. That is, the transfer part 104 prefers transferring the compressed data stored in the CPU-constraint process temporary hold part 106, however, the transfer part 104 transfers the compressed data stored in the NW bandwidth-constraint process hold part 105 to the analysis device 30 when no compressed data is stored in the CPU-constraint process temporary hold part 106.

The NW bandwidth-constraint process temporary hold part 105 and the CPU-constraint process temporary hold part 106 exemplify temporary hold parts of compressed data; hence, the present invention is not necessarily limited to them. The NW bandwidth-constraint process temporary hold part 105 is a buffer configured to store data after compression processes causing bottlenecks in NW bandwidths (hereinafter, referred to as NW bandwidth-constraint processes). In other words, the NW bandwidth-constraint process temporary hold part 105 is a storage unit configured to store data after NW bandwidth-constraint processes. The NW bandwidth-constraint processes are compression processes imposing constraints to transfer processing speeds rather than compression processing speeds. The CPU-constraint temporary hold part 106 is a buffer configured to store data after compression processes causing bottlenecks in CPU processes (hereinafter, referred to as CPU-constraint processes). In other words, the CPU-constraint process temporary hold part 106 is a storage unit configured to store data after CPU-constraint processes. The CPU-constraint processes are compression processes imposing constraints to compression processing speeds rather than transfer processing speeds.

The compression process selecting part 107 selects and sets compression processes, optimizing effective throughputs, to the compression processor 103. The compression process selecting part 107 selects the optimum algorithms executed with the compression processors 103 so as to determine whether those algorithms correspond to either NW bandwidth-constraint processes or CPU-constraint processes. That is, the compression process selecting part 107 selects algorithms, corresponding to either CPU-constraint processes or NW bandwidth-constraint processes, from among a plurality of algorithms (e.g. compression algorithms or non-compression algorithms) executable with the compression processors 103. The compression process selecting part 107 determines optimum algorithms corresponding to either CPU-constraint processes or NW bandwidth-constraint processes in accordance with compression processing speeds and compressibility of algorithms maximizing effective throughputs when the compression processors 103 carry out data compression using algorithms as well as the network bandwidths of the network 20 connecting between the transfer part 104 and the analysis device 30. In other words, the compression process selecting part 107 calculates data ratios applied to algorithms, maximizing effective throughputs when the compression processors 103 carry out compression processes for each data being compressed according to each algorithm, based on compression processing speeds, compressibility, and NW bandwidths, thus selecting optimum algorithms, corresponding to either CPU-constraint processes or NW bandwidth-constraint processes, based on the calculation results.

Figure 2:
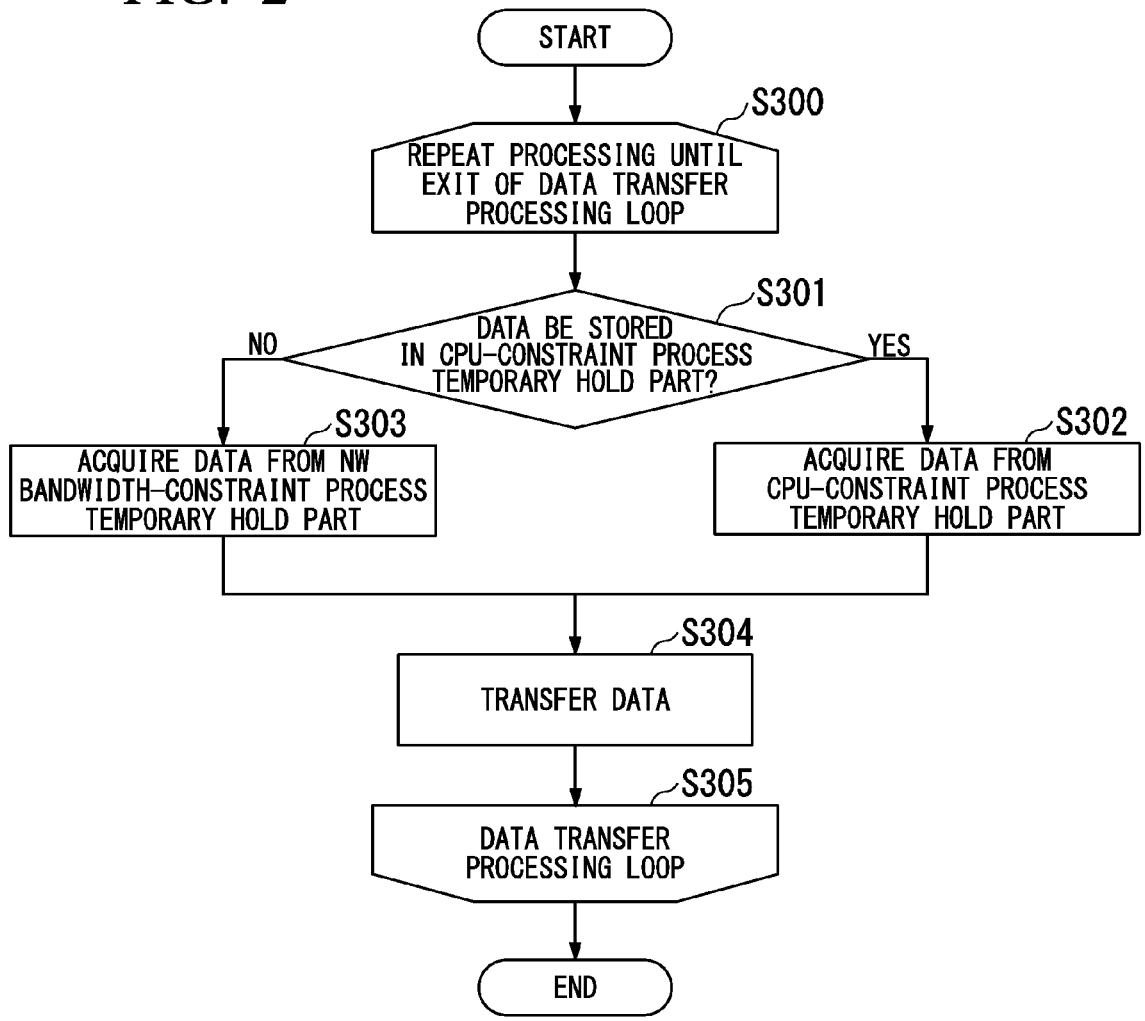
FIG. 2 is a flowchart showing an example of a data transfer process in a data transfer device according to one embodiment of the present invention.

Next, an example of a data transfer process according to the present embodiment will be described. FIG. 2 is a flowchart showing an example of the data transfer process according to the present embodiment. In the data transfer device 1, the transfer part 104 fetches compressed data from the temporary hold part (i.e. the NW bandwidth-constraint process temporary hold part 105 or the CPU-constraint process temporary hold part 106) so as to repeatedly carry out the data transfer processing loop, executing data transfer, until exit of the processing (step S300). First, the transfer part 104 confirms whether or not compressed data is stored in the CPU-constraint process temporary hold part 106 (step S301). When the CPU-constraint process temporary hold part 106 stores compressed data (i.e. the decision result of step S301 is "YES"), the transfer part 104 fetches compressed data from the CPU-constraint process temporary hold part 106 so as to transfer compressed data to the analysis device 30 through the network 20 (steps S302, S304). When the CPU-constraint process temporary hold part 106 does not store compressed data (i.e. the decision result of step S301 is "NO"), the transfer part 104 fetches compressed data from the NW bandwidth-constraint process temporary hold part 105 so as to transfer compressed data to the analysis device 30 through the network 20 (steps S303, S304). Thereafter, the transfer part 104 exits the data transfer processing loop of steps S300 to S305 so as to stop the data transfer process.

In the data transfer process of the present embodiment, the data transfer device 10 preferentially transmits the compressed data of the CPU-constraint process temporary hold part 106. It is expected that the size of compressed data is reduced due to high-efficient compression in the CPU-constraint process; hence, it is possible to improve an effective throughput by transmitting compressed data, derived from the CPU-constraint process, as much as possible. However, solely transmitting the compressed data may waste NW bandwidths since the amount of compressed data derived from the CPU-constraint process cannot achieve throughputs to spend all the NW bandwidths. Conversely, it is possible to effectively use NW bandwidths without any wastes by appropriately transmitting compressed data derived from the NW bandwidth-constraint process, thus preventing a waste of NW bandwidths.

Figure 3:
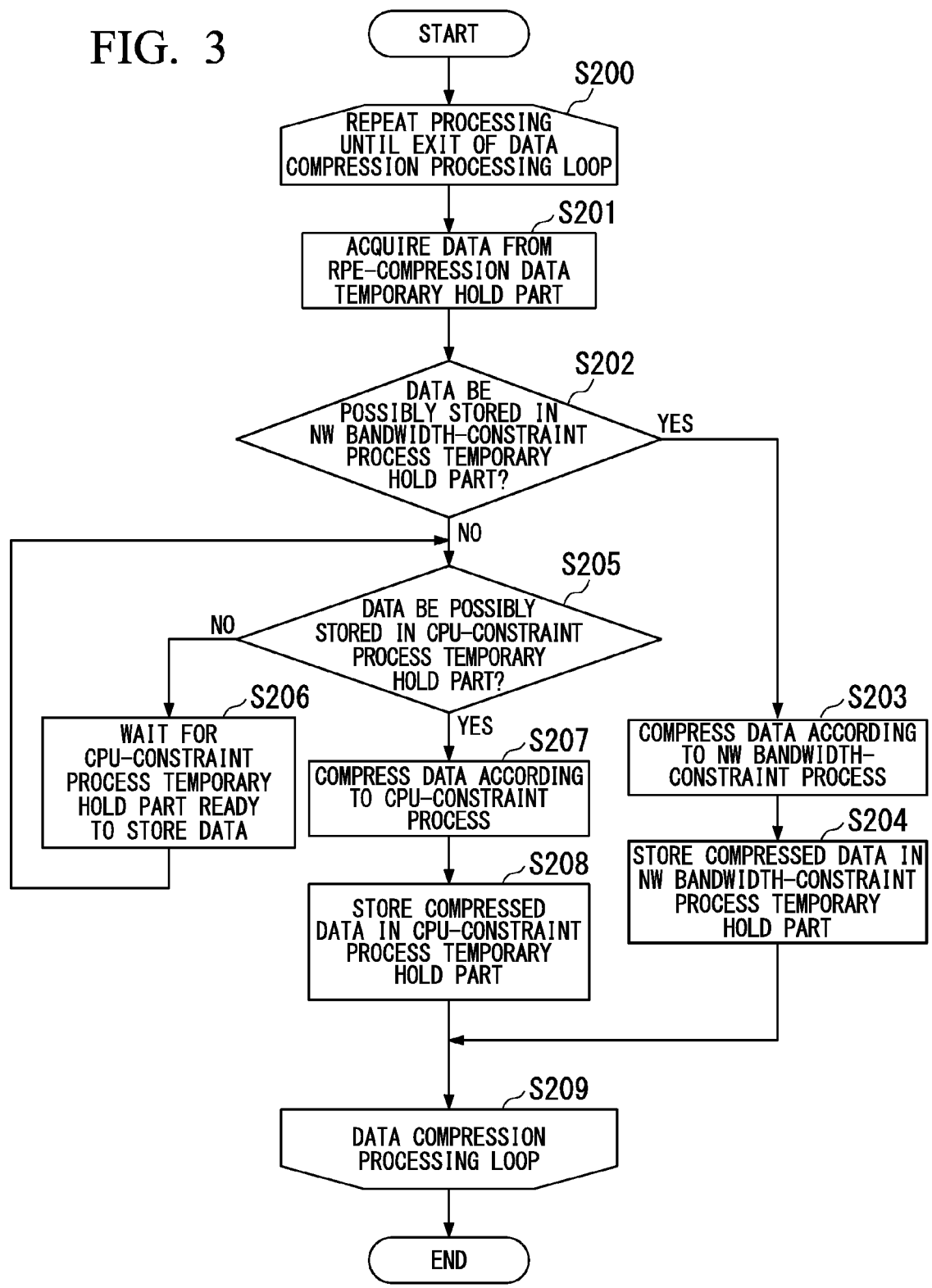
FIG. 3 is a flowchart showing an example of a data compression process in the data transfer device according to one embodiment of the present invention.

Next, an example of a data compression process according to the present embodiment will be described. FIG. 3 is a flowchart showing an example of the data compression process according to the present embodiment. The data transfer device 10 of the present embodiment repeatedly carry out the data compression processing loop, executing data compression using a plurality of algorithms with a plurality of compression processors 103, until exit of the processing (step S200). That is, the compression processor 103 compresses data held by the pre-compression data temporary hold part 102 in accordance with an algorithm, corresponding to either the NW bandwidth-constraint process or the CPU-constraint process, among a plurality of algorithms.

Specifically, the compression processor 103 fetches data in units of blocks each having the predetermined size from the pre-compression data temporary hold part 102 (step S201). The compression processor 103 determines whether or not compressed data can be stored in the NW bandwidth-constraint process temporary hold part 105 having an empty space (step S202). When the NW bandwidth-constraint process temporary hold part 105 has an empty space to store compressed data (i.e. the decision result of step S202 is "YES"), the compression processor 103 compresses data fetched from the pre-compression data temporary hold part 102 in accordance with an algorithm corresponding to the NW bandwidth-constraint process (step S203). Then, the compression processor 103 stores compressed data in the NW bandwidth-constraint process temporary hold prt 105 (step S204).

When the NW bandwidth-constraint process temporary hold part 105 does not have an empty space (i.e. the decision result of step S202 is "NO"), the compression processor 103 determines whether or not the CPU-constraint process temporary hold part 106 has an empty space to store compressed data (step S205). When the CPU-constraint process temporary hold part 106 does not have an empty space (i.e. the decision result of step S205 is "NO"), the compression processor 103 lodges in a standby state until an empty space is created in the CPU-constraint process temporary hold part 106 (step S206). When the CPU-constraint process temporary hold part 106 has an empty space to store compressed data (i.e. the decision result of step S205 is "YES"), the compression processor 103 compresses data fetched from the pre-compression data temporary hold part 102 in accordance with an algorithm corresponding to the CPU-constraint process (step S207). Then, the compression processor 103 stores compressed data in the CPU-constraint process temporary hold part 106 (step S208). Thereafter, the compression processor 103 exits the data compression processing loop (step S209).

As described above, the compression processors 103 preferentially stores compressed data in the NW bandwidth-constraint process temporary hold part 105 rather than the CPU-constraint process temporary hold part 106. This makes it possible to effectively use NW bandwidths while supplying compressed data having high compressibility to the transfer part 104.

Figure 4:
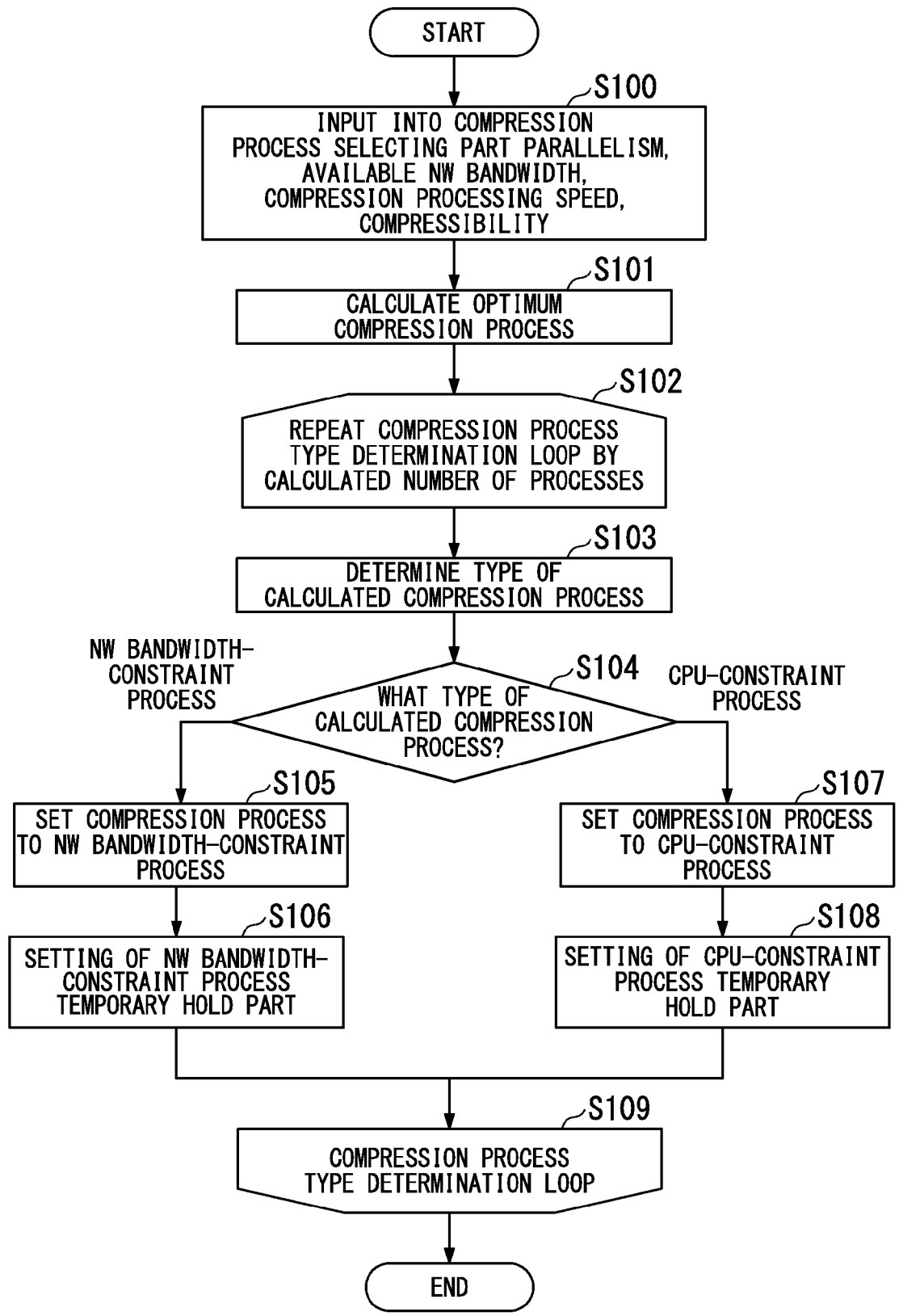
FIG. 4 is a flowchart showing an example of a data compression process setting method in the data transfer device according to one embodiment of the present invention.

Next, a data compression process setting method according to the present embodiment will be descried. FIG. 4 is a flowchart showing an example of the data compression process setting method according to the present embodiment. The data transfer device 10 calculates a combination of optimum compression processes according to mathematical models so as to set an algorithm corresponding to the NW bandwidth-constraint process and an algorithm corresponding to the CPU-constraint process based on the calculation results. Hereinafter, the sequence of entire processing will be described on the precondition that the compression process selecting part 107 selects optimum compression processes based on calculation results using mathematical models.

First, the compression process selecting part 107 inputs parameters necessary to calculate optimum compression processes with mathematical models (step S100). In the present embodiment, the compression process selecting part 107 inputs parameters representing parallelism P, an available NW bandwidth N, a compression processing speed $C_i$ and compressibility $R_i$ for each algorithm i. The parallelism P denotes the number of CPU cores executing parallel processing with the compression processors 103. The available NW bandwidth N denotes the NW bandwidth of the network 20. The compression process selecting part 107 select compression algorithms optimizing effective throughputs based on calculation results produced by assigning input parameters to mathematical models (step S101).

Next, the compression process selecting part 107 sets compression processes and temporary hold parts of compressed data with the compression processors 103 in response to the number of the calculated compression algorithms (step S102). The compression process selecting part 107 determines the types of compression algorithms optimizing effective throughputs (step S103). The determination process uses mathematical models, the details of which will be described later.

The compression process selecting part 107 determines whether each of compression algorithms optimizing effective throughputs is an algorithm corresponding to the CPU-constraint process or an algorithm corresponding to the NW bandwidth-constraint process (step S104). Details will be described later. Herein, it is determined whether or not the product using the parallelism P, the compression processing speed $C_i$ and the compressibility $R_i$ for each algorithm i is larger than the NW bandwidth N.

For example, when a compression algorithm optimizing an effective throughput corresponds to the CPU-constraint process, the compression process selecting part 107 sets to the compression processor 103 the compression algorithm as the CPU-constraint process algorithm. In this case, the compression processor 103 sets the destination of temporarily holding compressed data, produced according to the CPU-constraint process algorithm, to the CPU-constraint process temporary hold part 106. When a compression algorithm optimizing an effective throughput corresponds to the NW bandwidth-constraint process, the compression process selecting part 107 sets to the compression processor 103 the compression algorithm as the NW bandwidth-constraint process algorithm. In this case, the compression processor 103 sets the destination of temporarily holding compressed data, produced according to the NW bandwidth-constraint process algorithm, to the NW bandwidth-constraint process temporary hold part 105. In this connection, selecting and determining compression algorithms optimizing effective throughputs will be implemented before the data transfer process.

The present embodiment is designed to install the compression process selecting part 107 in the data transfer device 10, but it is possible to arrange the compression process selecting part 107 independently of the data transfer device 10. Additionally, the present embodiment is designed to separately configure the NW bandwidth-constraint process temporary hold part 105 and the CPU-constraint process temporary hold part 106, but it is possible to configure them with a single storage unit. In this case, the compression processor 103 sets a threshold representing the amount of data corresponding to the maximum storage capacity of the NW bandwidth-constraint process temporary hold part 105, thus determining whether or not the amount of data stored in the storage unit is less than the threshold. Alternatively, the compression processor 103 may determine whether or not the amount of compressed data derived from the NW bandwidth-constraint process is less than the threshold with reference to attribute information attached to the stored data of the storage unit. The process of determining whether or not the NW bandwidth-constraint process temporary hold part 105 has an empty space is an example of the process of determining whether or not the amount of data transferred with the transfer part 104 is smaller than the predetermined value or an example of the process of determining whether or not the amount of compressed data derived from the NW bandwidth-constraint process among data transferred with the transfer part 104 is smaller than the predetermined value.

The present embodiment involves high-efficient compression processes in the CPU-constraint process rather than the NW bandwidth-constraint process; hence, it is expected that compressed data held by the CPU-constraint process temporary hold part 106 is subjected to high-efficient compression processes and reduced in data size. For this reason, the data transfer device 10 can transfer compressed data held by the CPU-constraint process temporary hold part 106 as much as possible rather than compressed data held by the NW bandwidth-constraint process temporary hold part 105, thus improving effective throughputs. However, compressed data derived from the CPU-constraint process may not achieve a data throughput completely spending the NW bandwidth; hence, solely transferring compressed data of the CPU-constraint process may cause a waste of NW bandwidths. This may develop a tradeoff relationship between an improvement of an effective throughput and the effective use of the NW bandwidth.

To prevent a waste of NW bandwidths, the data transfer device 10 preferentially transfers compressed data held by the CPU-constraint process temporary hold part 106 while holding a certain amount of compressed data in the NW bandwidth-constraint process temporary hold part 105. This allows the data transfer device 10 to hold a certain amount of compressed data. In other words, the transfer part 104 is able to continuously transfer compressed data held by the CPU-constraint process temporary hold part 106 or the NW bandwidth-constraint temporary hold part 105, thus entirely using NW bandwidths without any wastes.

The data transfer device 10 produces compressed data according to the CPU-constraint process and preferentially transfers compressed data on the condition that the NW bandwidth-constraint process temporary hold part 105 holds a certain amount of compressed data in order to improve an effective throughput. This makes it possible to transfer compressed data, derived from high-efficient compression processes, as much as possible, thus improving an effective throughput. Therefore, it is possible for the data transfer device 10 to effectively use NW bandwidths while improving an effective throughput.

When the NW bandwidth-constraint process temporary hold part 105 does not hold a certain amount of compressed data, the data transfer device 10 preferentially transfers compressed data according to the NW bandwidth-constraint process imposing a constraint to the transfer processing speed rather than the compression processing speed. When the NW bandwidth-constraint process temporary hold part 105 holds a certain amount of compressed data, the data transfer device 10 preferentially transfers compressed data according to the CPU-constraint process imposing a constraint to the compression processing speed rather than the transfer processing speed. Owing to the above function, the data transfer device 10 is able to effectively use resources of the compression processors 103, thus improving an effective throughput. Additionally, it is possible for the data transfer device 10 to reduce the time required to store a certain amount of compressed data in the NW bandwidth-constraint process temporary hold part 105.

Figures 5, 6:
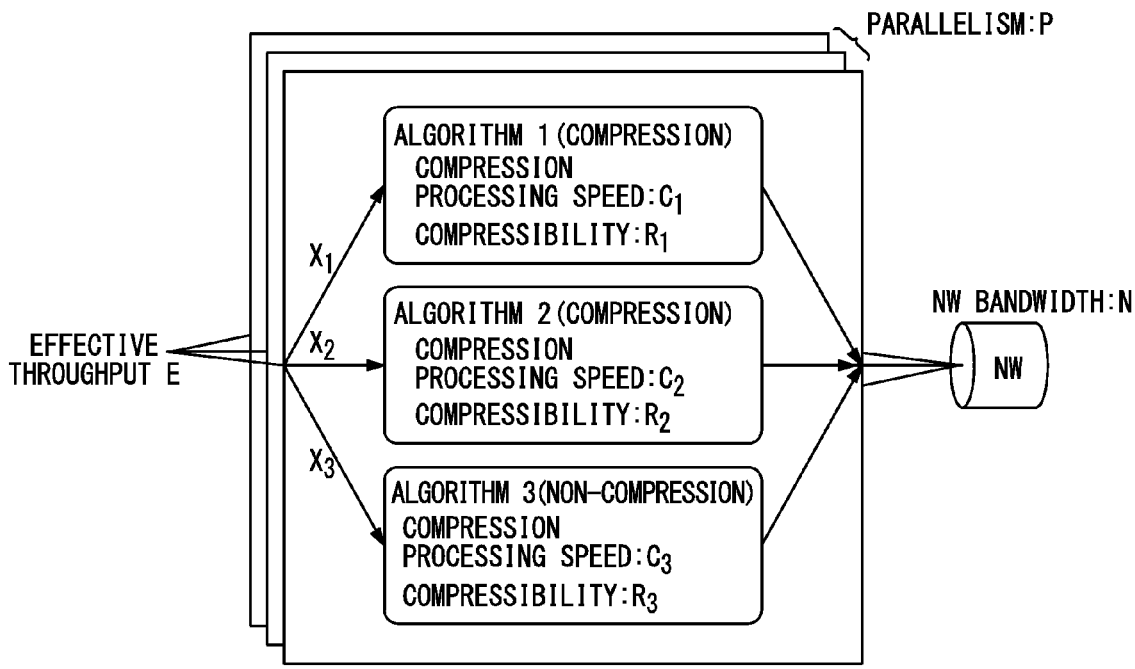
FIG. 5 is a conceptual diagram showing a method of executing a transfer process and a compression process on data according to a plurality of compression algorithms.
FIG. 6 is a list showing the execution results and the parameters of algorithms executed with the data transfer device.
Figure 7:
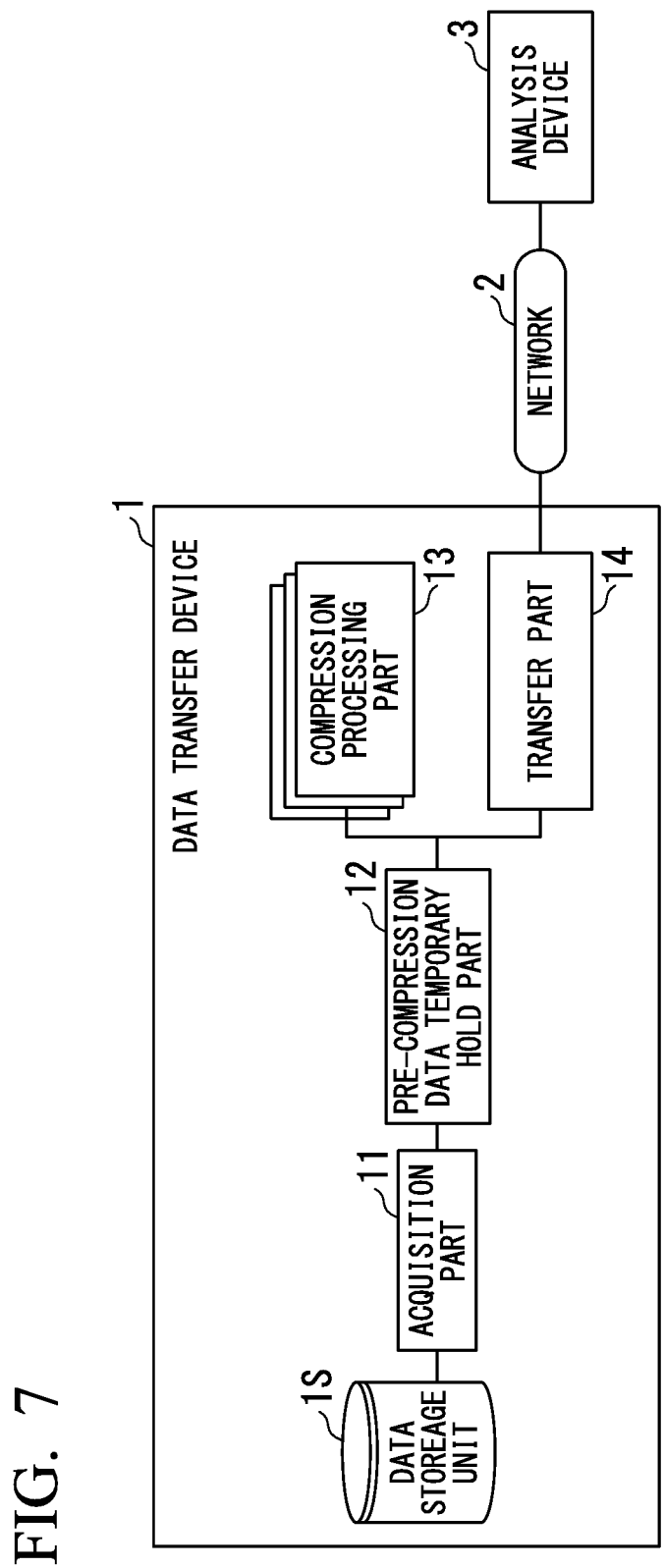
FIG. 7 is a block diagram showing the basic configuration of a data transfer system.

Next, mathematical models used for calculating optimum compression processes maximizing effective throughputs and for determining a temporary hold part of compressed data will be described. FIG. 5 is a conceptual diagram showing a method of executing compression processes and transfer processes on data in accordance with a plurality of compression algorithms. Mathematical models maximizing the effective throughput E will be constructed based on the conceptual diagram of FIG. 5. FIG. 5 shows three types of algorithms 1-3. Herein, $C_1$ denotes a throughput (i.e. a compression processing speed) produced by fully using a single CPU core according to compression algorithm 1, while $C_2$ denotes a throughput produced by fully using a single CPU core according to compression algorithm 2. Herein, $R_1$, $R_2$ denote compressibility values of compression algorithms 1, 2. The compressibility represents a ratio of the size of compressed data to the original size of data, wherein a smaller value of compressibility indicates higher compression efficiency. In this connection, the present embodiment handles non-compression processes as one type of compression processes since non-compression processes have compressibility "1". That is, $C_3$ denotes a throughput produced by fully using a single CPU core according to non-compression algorithm 3, and $R_3$ denotes compressibility of non-compression algorithm 3. Additionally, N denotes an available bandwidth, wherein the CPU cost for transmitting data to the network 20 will be neglected. The compression process selecting part 107 has calculated throughputs $C_1$, $C_2$, $C_3$ of compression algorithms 1, 2 and non-compression algorithm 3, and compressibility values $R_1$, $R_2$, $R_3$ in advance. In this connection, the compression processors 103 may calculate throughputs C1, C2, C3, and compressibility values R1, R2, R3 based on the amount and the type of test data subjected to compression processes.

The compression processor 103 operates compression algorithms 1, 2, and non-compression algorithm 3 in response to a data rate set to single parallel processing. In other words, the compression processor 103 independently executes compression algorithms 1, 2, and non-compression algorithm 3 in response to the predetermined data rate by fully using a single CPU core. In this connection, the predetermined data rate at "0%" indicates non-execution of any compression algorithms. In the present embodiment, the compression processor 103 operates a compression process of compression algorithm 1 at a data rate $x_1$ (where $0 \le x_1 \le 1$) but operates a compression process of compression algorithm 2 at a data rate $x_2$ (where $0 \le x_1 \le 2$). However, the compression processor 103 does not operate a compression process at a data rate $x_3$ (where $0 \le x_1 \le 3$). At this time, the throughput of compressed data from the compression processor 103 using a CPU resource of single parallel processing is represented by $(C_1 x_1 + C_2 x_2 + C_3 x_3)$. The throughput of compressed data from the compression processor 103 is represented by $(C_1 x_1 R_1 + C_2 x_2 R_2 + C_3 x_3 R_3)$. The throughput of compressed data due to execution of parallel processing with CPUs having parallelism P is represented by $P(C_1 x_1 R_1 + C_2 x_2 R_2 + C_3 x_3 R_3)$. For example, parallelism is "P=3" when the compression processor 103 uses three CPU cores to carry out compression processes (including a non-compression process) in parallel.

As described above, the effective throughput E will be represented by $P(C_1 x_1 + C_2 x_2 + C_3 x_3)$ unless the throughput of data subjected to parallel compression processes, $P(C_1 x_1 R_1 +$ $C_2x_2R_2+C_3x_3R_3$), exceeds the NW bandwidth N. In contrast, when the throughput of data subjected to parallel compression processes, $P(C_1x_1R_1+C_2x_2R_2+C_3x_3R_3)$, exceeds the NW bandwidth N, the effective throughput E will be represented by $N(C_1x_1+C_2x_2+C_3x_3)/(C_1x_1R_1+C_2x_2R_2+C_3x_3R_3)$. Therefore, the compression process selecting part 107 can calculate the optimum effective throughput E by resolving the linear programming problem given by Equation 1.

[Equation 1]

Maximize:

$$E=P(C_1x_1+C_2x_2+C_3x_3)$$

for $$P(C_1x_1R_1+C_2x_2R_2+C_3x_3R_3) \leq N \quad (A)$$

$$E=N(C_1x_1+C_2x_2+C_3x_3)/(C_1x_1R_1+C_2x_2R_2+C_3x_3R_3)$$

for $$N<P(C_1x_1R_1+C_2x_2R_2+C_3x_3R_3) \quad (B)$$

Subject to:
$0 \leq x_1 \leq 1$
$0 \leq x_2 \leq 1$
$0 \leq x_3 \leq 1$
$x_1+x_2+x_3 \leq 1$ The compression process selecting part 107 is able to produce a combination of data rates ($x_1$, $x_2$, $x_3$) maximizing the effective throughput E by resolving the linear programming problem according to the simplex method. The compression process selecting part 107 selects an optimum combination of a non-compression algorithm and a compression algorithm with a data rate $x_i$ (where i denotes a number identifying a compression algorithm or a non-compression algorithm) higher than zero. That is, the data rate $x_i \leq 0$ indicates nonexistence of data subjected to algorithm i. This indicates that an optimum combination of compression/non-compression algorithms does not include algorithm i.

The compression process selecting part 107 determines whether a compression algorithm or a non-compression algorithm included in an optimum combination of compression/non-compression algorithms is set to the CPU-constraint process or the NW bandwidth-constraint process. In the present embodiment, the compression process selecting part 107 calculates $PR_iC_i$ with respect to each algorithm i (i.e. a compression algorithm or a non-compression algorithm) included in the optimum combination so as to determine whether or not $PR_iC_i$ exceeds the NW bandwidth N. That is, the compression process selecting part 107 determines that algorithm i with $PR_iC_i<N$ is an algorithm corresponding to the CPU-constraint process. Additionally, the compression process selecting part 107 determines that algorithm i with $PR_iC_i \geq N$ is an algorithm corresponding to the NW bandwidth-constraint process.

Next, the method of calculating an optimum combination of compression/non-compression algorithms with the compression process selecting part 107 (i.e. the details of step S101 in FIG. 4) will be described. For example, it is assumed that parameters $C_1$=108.89 MB/s, $R_1$=0.68 are set to compression algorithm 1; parameters $C_2$=17.88 MB/s, $R_2$=0.38 are set to compression algorithm 2; and parameters $C_3$=512950 MB/s, $R_3$=1 are set to non-compression algorithm 3. FIG. 6 shows parameters set to each algorithm i. Additionally, the compression processor 103 carries out a compression process using five CPU cores with parallelism P=5. Moreover, an available NW bandwidth N=110 MB/s is set to the network 20.

The compression process selecting part 107 carries out a simplex method using the foregoing parameters assigned to (A), (B) of Equation 1 so as to calculate a combination of data rates ($x_1$, $x_2$, $x_3$) maximizing the effective throughput E. As shown in FIG. 6, the compression process selecting part 107 produces the maximum effective throughput E=192.52 MB/s with respect to a data rate ($x_1$, $x_2$, $x_3$)=(0.22, 0.77, 0) after a compression process. The compression process selecting part 107 selects an optimum combination of compression/non-compression algorithms maximizing the effective throughput E (i.e. a combination of algorithms with the data rate $x_i$ higher than zero). In this case, the compression process selecting part 107 selects an optimum combination of compression algorithms 1, 2.

The compression process selecting part 107 calculates $PR_1C_1$=370.22 MB/s, $PR_2C_2$=33.972 MB/s with respect to compression algorithms 1, 2 using the foregoing parameters. When $PR_1C_1>N$, the compression process selecting part 107 selects compression algorithm 1 as the NW bandwidth-constraint process algorithm. When $PR_2C_2<N$, the compression process selecting part 107 selects compression algorithm 2 as the CPU-constraint process algorithm.

It is possible to adopt the technology disclosed in Patent Literature Document 3 for use in the process of the analysis device 30 carried out on data transferred from the data transfer device 10. Thus, the analysis device 30 determines whether or not received data from the data transfer device 10 is either compressed data or uncompressed data, thus delivering received data to a temporary storage unit (not shown) based on the determination result. The analysis device 30 can sequentially receive data transferred from the data transfer device 10 without degrading performance since it executes processing by solely restoring compressed data. In this connection, the data transfer device 10 of the present embodiment may employ various methods of determining compressed data without any restrictions; hence, it is possible to employ a method of embedding compression type information in data subjected to a transfer process or a method of preparing a logical transfer path for each type of compression.

Next, various effects of the present embodiment will be described. According to the first effect, the compression processors 103 can efficiently use CPU resources so as to improve effective throughputs. The first effect can be explained with two reasons. The first reason relates to the configuration of the data transfer device 10 including the pre-compression data temporary hold part 102, the NW bandwidth-constraint process temporary hold part 105, and the CPU-constraint process temporary hold part 106. This may not cause a wasteful operation of the compression processor 103 to repeatedly fetch the already-compressed data since temporary hold parts are prepared independently for the compression process and the transfer process. The second reason relates to the configuration of the data transfer device 10 including the NW bandwidth-constraint process temporary hold part 105 and the CPU-constraint process temporary hold part 106. That is, it is possible to transmit compressed data without causing a waste of NW bandwidths by transmitting high-efficient compressed data, contributing to an improvement of an effective throughput derived from the CPU-constraint process, as much as possible since temporary hold parts are arranged to independently store compressed data derived from the NW bandwidth-constraint process and the CPU-constraint process. According to the second effect, it is possible to improve an effective throughput by effectively using available CPU resources without any wastes. This is because the compression process selecting part 107 calculates a compression algorithm, maximally using CPU resources and optimizing an effective throughput, among a plurality of compression algorithms in accordance with mathematical models based on available CPU resources and NW bandwidths.

The data transfer device 10 of the present embodiment can improve an effective throughput by increasing parallelism of compression processes, thus reducing a data transfer time. Additionally, the data transfer device 10 of the present embodiment can be applied to any usages requiring high-speed transferring of numerous data.

Figure 8:
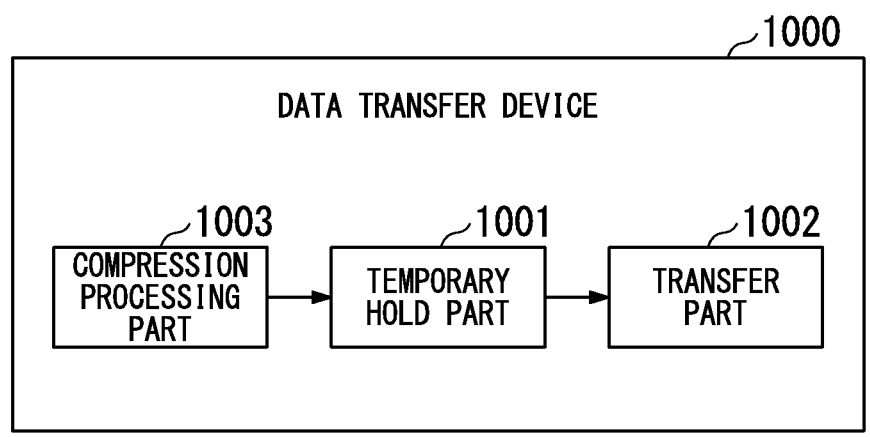
FIG. 8 is a block diagram showing the minimum configuration of a data transfer device according to the present invention.

Next, the minimum configuration of a data transfer device according to the present invention will be described. FIG. 8 is a block diagram of a data transfer device 1000 having the minimum configuration of the present invention. The data transfer device 1000 includes a temporary hold part 1001 configured to temporarily store at least compressed data, a transfer part 1002 configured to transfer compressed data, read from the temporary hold part 1001, to a desired destination, and a compression processor 1003. When the amount of compressed data stored in the temporary hold part 1001 is smaller than the predetermined value, the compression processor 1003 compresses data according to the NW bandwidth-constraint process imposing a constraint to the transfer processing speed rather than the compression processing speed, thus storing compressed data in the temporary hold part 1001. When the amount of compressed data stored in the temporary hold part 1001 is larger than the predetermined value, the compression processor 1003 compresses data according to the CPU-constraint process imposing a constraint to the compression processing speed rather than the transfer processing speed, thus storing compressed data in the temporary hold part 1001. In this connection, the temporary hold part 1001 embraces the functions of the NW bandwidth-constraint process temporary hold part 105 and the CPU-constraint process temporary hold part 106.

The data transfer device 10 of the present embodiment includes a computer system therein. The processing procedure is stored in computer-readable storage media in the form of programs, whereby the computer system reads and executes programs. Herein, the "computer system" may embrace a CPU, a memory device, software such as an operating system (OS), and hardware such as peripheral devices. Additionally, the "computer system" using the WWW system may embrace homepage providing environments (or homepage display environments). Moreover, it is possible to store programs realizing the foregoing functions and steps in computer-readable storage media, and therefore it is possible for the computer system to load programs from storage media, thus executing programs. In this connection, the "computer-readable storage media" refer to flexible disks, magneto-optic disks, ROM, rewritable non-volatile memory such as flash memory, portable media such as CD-ROM, and storage units such as hard disks installed in the computer system.

Additionally, the "computer-readable storage media" may embrace any means of holding programs for certain times such as non-volatile memory (e.g. DRAM) installed in servers or clients used to transmit or receive programs via communication lines, telephone lines, networks, or the Internet. Programs can be transmitted from storage units of computer systems to other computer systems via transmission media or propagation waves in transmission media. The "transmission media" used to transmit programs refer to any media having functions of transmitting information such as communication lines like telephone lines and communication networks like networks and the Internet. Programs may achieve part of the foregoing functions. Alternatively, programs may be drafted as differential files (or differential programs) which are combined with pre-installed programs, already stored in the computer system, so as to achieve the foregoing functions.

Lastly, the present invention is not necessarily limited to the foregoing embodiments; hence, it is possible to replace the foregoing constituent elements with the known components or to implement design changes; thus, it is possible to realize various modifications within the scope of the invention as defined by the appended claims.

INDUSTRIAL APPLICABILITY

The present invention provides a data transfer device and a data transfer system improving an effective throughput by reviewing the compression processing procedure and the transfer processing procedure, thus using NW bands without any wastes while effectively using CPU resources. The present invention is applicable to a broad range of fields such as computer systems, network systems, and cloud computing systems.

REFERENCE SIGNS LIST 1 data transfer device
2 network
3 analysis device
10 data transfer device
20 network
30 analysis device
100 data storage unit
101 acquisition part
102 pre-compression data temporary hold part
103 compression processor
104 transfer part
105 NW bandwidth-constraint process temporary hold part
106 CPU-constraint process temporary hold part
107 compression process selecting part
1000 data transfer device
1001 temporary hold part
1002 transfer part
1003 compression processor

The invention claimed is:
1. A data transfer device comprising at least one processor to implement:
  a compression processing part configured to compress data in accordance with an optimum compression algorithm, which is selected from among a plurality of algorithms by way of comparison of compressibility and a network bandwidth, with respect to a central processing unit (CPU) constraint process preferential to a network (NW) bandwidth-constraint process;
  a temporary hold part configured to temporarily hold compressed data; and
  a transfer part configured to transfer compressed data, read from the temporary hold part, through a network,
  wherein the compression processing part stores compressed data according to the NW bandwidth-constraint process in the temporary hold part when an amount of compressed data held by the temporary hold part is smaller than a predetermined value, and wherein the compression processing part stores compressed data according to the CPU-constraint process in the temporary hold part when the amount of compressed data held by the temporary hold part is larger than the predetermined value;

wherein the optimum compression algorithm is selected based on a product using a parallelism P, a compression processing speed C and a compressibility R compared to a network bandwidth N, wherein the CPU-constraint process is selected when PRC<N while the NW bandwidth-constraint process is selected when PRC≥N.

2. The data transfer device according to claim 1, wherein the at least one processor further implements a compression process selecting part configured to select the optimum compression algorithm applied to whether the CPU-constraint process or the NW bandwidth-constraint process based on a compression processing speed and compressibility maximizing an effective throughput compared to the network bandwidth of the network connected to the transfer part, wherein the compression processing part executes the CPU-constraint process preferential to the NW bandwidth-constraint process in accordance with the optimum compression algorithm selected by the compression process selecting part.

3. The data transfer device according to claim 2, wherein the compression process selecting part calculates a data rate subjected to the plurality of compression algorithms based on the compression processing speed and the compressibility maximizing the effective throughput compared to the network bandwidth, thus selecting the optimum compression algorithm applied to the CPU-constraint process preferential to the NW bandwidth-constraint process based on the data rate.

4. The data transfer device according to claim 1, wherein the at least one processor further implements a pre-compression data temporary hold part configured to temporarily hold data supplied to the compression processing part.

5. The data transfer device according to claim 1, wherein the temporary hold part includes an NW bandwidth-constraint process temporary hold part configured to temporarily hold compressed data according to the NW bandwidth-constraint process and a CPU-constraint process temporary hold part configured to temporarily hold compressed data according to the CPU-constraint process, wherein the compression processing part stores compressed data according to the NW bandwidth-constraint process in the NW bandwidth-constraint process temporary hold part when the NW bandwidth-constraint process temporary hold part has a free space, wherein the compression processing part stores compressed data according to the CPU-constraint process in the CPU-constraint process temporary hold part when the NW bandwidth-constraint process temporary hold part has no free space but the CPU-constraint process temporary hold part has free space, wherein the transfer part preferentially transfers compressed data stored in the CPU-constraint process temporary hold part rather than compressed data stored in the NW bandwidth-constraint process temporary hold part, and wherein the transfer part transfers compressed data stored in the NW bandwidth-constraint process temporary hold part when the CPU-constraint process temporary hold part does not store compressed data.

6. A data transfer system comprising a data transfer device configured to transfer compressed data and a receiver device configured to receive compressed data through a network, wherein the data transfer device includes:

a compression processing part configured to compress data in accordance with an optimum compression algorithm, which is selected from among a plurality of compression algorithms by way of comparison of compressibility and a network bandwidth, with respect to a central processing unit (CPU) constraint process preferential to a network (NW) an NW bandwidth-constraint process;

a temporary hold part configured to temporarily hold compressed data; and a transfer part configured to transfer compressed data, read from the temporary hold part, through the network, wherein the compression processing part stores compressed data according to the NW bandwidth-constraint process in the temporary hold part when an amount of compressed data held by the temporary hold part is smaller than a predetermined value, and wherein the compression processing part stores compressed data according to the CPU-constraint process in the temporary hold part when the amount of compressed data held by the temporary hold part is larger than the predetermined value, wherein the optimum compression algorithm is selected based on a product using a parallelism P, a compression processing speed C and a compressibility R compared to a network bandwidth N, wherein the CPU-constraint process is selected when PRC<N while the NW bandwidth-constraint process is selected when PRC≥N.

7. A data compression transfer method, further comprising:

selecting an optimum compression algorithm from among a plurality of compression algorithms by way of comparison of compressibility and a network bandwidth with respect to a central processing unit (CPU)-constraint process preferential to a network (NW) bandwidth-constraint process, wherein the optimum compression algorithm is given a priority preferring the CPU-constraint process, imposing a constraint to a compression processing speed rather than a transfer processing speed, to the NW bandwidth-constraint process imposing a constraint to a transfer processing speed rather than a compression processing speed;

compressing data according to the optimum compression algorithm:

holding compressed data in a temporary hold part before a transfer process;

comparing an amount of compressed data held by the temporary hold part with a predetermined value;

storing compressed data according to the NW bandwidth-constraint process in the temporary hold part when the amount of compressed data held by the temporary hold part is smaller than the predetermined value; and storing compressed data according to the CPU-constraint process in the temporary hold part when the amount of compressed data held by the temporary hold part is larger than the predetermined value;

wherein the optimum compression algorithm is selected based on a product using a parallelism P, a compression processing speed C and a compressibility R compared to a network bandwidth N, wherein the CPU-constraint process is selected when PRC<N while the NW bandwidth-constraint process is selected when PRC≥N.

* * * * *